(12) United States Patent
Miyazawa

(10) Patent No.: US 12,272,624 B2
(45) Date of Patent: Apr. 8, 2025

(54) SEMICONDUCTOR DEVICE HAVING LEAD CONNECTING A SEMICONDUCTOR CHIP TO A FRAME AND PROJECTION EXTENDING FROM FRAME AND A METHOD OF MANUFACTURING SEMICONDUCTOR DEVICE

(71) Applicant: Mitsubishi Electric Corporation, Tokyo (JP)

(72) Inventor: Masaomi Miyazawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 421 days.

(21) Appl. No.: 17/591,527

(22) Filed: Feb. 2, 2022

(65) Prior Publication Data

US 2023/0005823 A1    Jan. 5, 2023

(30) Foreign Application Priority Data

Jul. 5, 2021   (JP) ................................. 2021-111610

(51) Int. Cl.
*H01L 23/495* (2006.01)
*H01L 21/56* (2006.01)
*H01L 23/31* (2006.01)

(52) U.S. Cl.
CPC ........ *H01L 23/49541* (2013.01); *H01L 21/56* (2013.01); *H01L 23/3107* (2013.01)

(58) Field of Classification Search
CPC ... H01L 21/56; H01L 23/04; H01L 23/49524; H01L 23/49562; H01L 2224/40245; H01L 23/4952; H01L 21/4825; H01L 23/49575

USPC .......................................................... 257/670
See application file for complete search history.

(56) References Cited

U.S. PATENT DOCUMENTS 7,374,965 B2 * 5/2008 Muto ................ H01L 23/49537
                                                 257/E23.044
10,483,216 B2 * 11/2019 Yoshihara ........... H01L 29/7397

FOREIGN PATENT DOCUMENTS

JP          2015-207675 A      11/2015
JP          2018152468 A    *   9/2018
WO       WO-2017071418 A1  *   5/2017

OTHER PUBLICATIONS

An Office Action; "Notice of Reasons for Refusal," mailed by the Japanese Patent Office on May 28, 2024, which corresponds to Japanese Patent Application No. 2021-111610 and is related to U.S. Appl. No. 17/591,527; with English language translation.

* cited by examiner

*Primary Examiner* — Jami Valentine Miller
*Assistant Examiner* — Dilinh P Nguyen
(74) *Attorney, Agent, or Firm* — Studebaker Brackett PLLC

(57) ABSTRACT

According to the present disclosure, a semiconductor device includes a semiconductor chip, a frame, a projection projecting from the frame, a lead in which a projection insertion portion into which the projection is to be inserted is formed, and which directly contacts the frame to electrically connect the semiconductor chip to the frame and a first bonding material configured to bond the projection to the lead.

17 Claims, 7 Drawing Sheets

SEMICONDUCTOR DEVICE HAVING LEAD CONNECTING A SEMICONDUCTOR CHIP TO A FRAME AND PROJECTION EXTENDING FROM FRAME AND A METHOD OF MANUFACTURING SEMICONDUCTOR DEVICE

BACKGROUND OF THE INVENTION

Field

The present disclosure relates to a semiconductor device and a method of manufacturing the semiconductor device.

Background

JP 2018-152468 A discloses a semiconductor device that includes a die pad portion having a chip mounting surface and a lead portion spaced from the die pad portion. A first electrode of a chip is bonded to the chip mounting surface through a first conductive bonding material. A connector has one end bonded to a second electrode of the chip through a second conductive bonding material, and has the other end bonded to the lead portion through a third conductive bonding material. The lead portion has a protrusion that projects in a thickness direction of the lead portion and that has a cross-sectional area decreasing toward a tip thereof. The connector has a through hole formed in the other end thereof. The through hole is engaged with the protrusion at a predetermined height position of the protrusion.

In JP 2018-152468 A, the protrusion of the lead portion contacts the inside of the through hole formed in the connector. Accordingly, in the case where a diameter of the through hole is small, in the case where a diameter of the protrusion is large, in the case where the connector is mounted obliquely with respect to the lead portion, or in the case where an amount of the bonding material is small, for example, a space between the connector and the lead portion cannot be sufficiently filled with the bonding material, which may make it impossible to obtain sufficient bonding strength.

SUMMARY

The present disclosure has been made to solve the above-described problems, and an object thereof is to provide a semiconductor device capable of stably bonding a lead electrically connecting a semiconductor chip to a frame, and a method of manufacturing the semiconductor device.

The features and advantages of the present disclosure may be summarized as follows.

According to an aspect of the first disclosure, a semiconductor device includes a semiconductor chip, a frame, a projection projecting from the frame, a lead in which a projection insertion portion into which the projection is to be inserted is formed, and which directly contacts the frame to electrically connect the semiconductor chip to the frame and a first bonding material configured to bond the projection to the lead.

According to an aspect of the second disclosure, a semiconductor device includes a semiconductor chip, a case configured to store the semiconductor chip, a frame and a lead which is to be bonded to an obverse surface of the frame through a bonding material to electrically connect the semiconductor chip to the frame, wherein the case has a protrusion projecting from the obverse surface, and the protrusion is provided on a periphery of a bonding portion between the obverse surface and the lead.

According to an aspect of the third disclosure, a method of manufacturing a semiconductor device includes electrically connecting a semiconductor chip to a lead and inserting a projection projecting from a frame into a projection insertion portion formed in the lead and bonding the projection to the lead in a state in which the frame and the lead directly contact each other to be electrically connected to each other.

According to an aspect of the fourth disclosure, a method of manufacturing a semiconductor device includes insert molding a frame with a case configured to store a semiconductor chip to form a protrusion projecting from an obverse surface of the frame in the case and bonding a lead to the obverse surface through a bonding material to electrically connect the semiconductor chip to the frame through the lead, wherein the protrusion is provided on a periphery of a bonding portion between the obverse surface and the lead.

Other and further objects, features and advantages of the disclosure will appear more fully from the following description.

DESCRIPTION OF EMBODIMENTS

Figure 1:
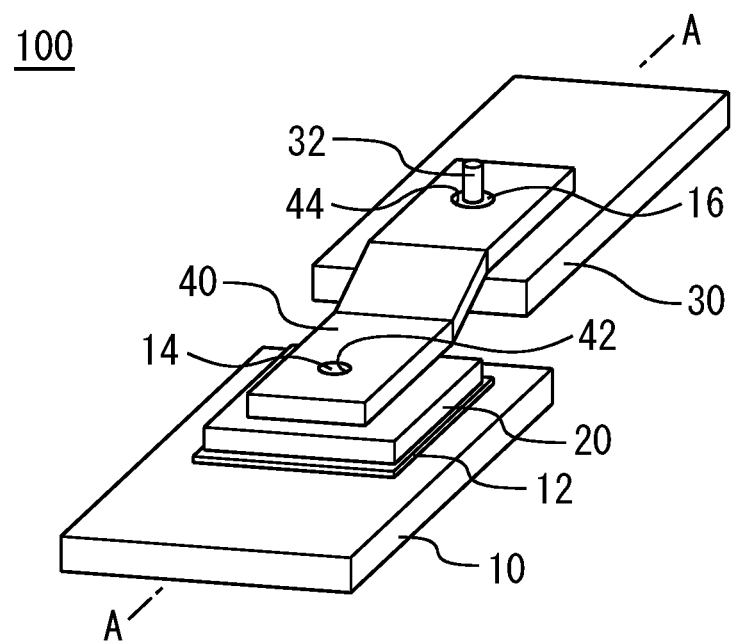
FIG. 1 is a perspective view of a semiconductor device according to a first embodiment.

Semiconductor devices and methods of manufacturing the semiconductor devices according to embodiments of the present disclosure will be described with reference to the accompanying drawings. Components identical or corresponding to each other are indicated by the same reference characters, and repeated description of them is avoided in some cases.

First Embodiment

Figure 2:
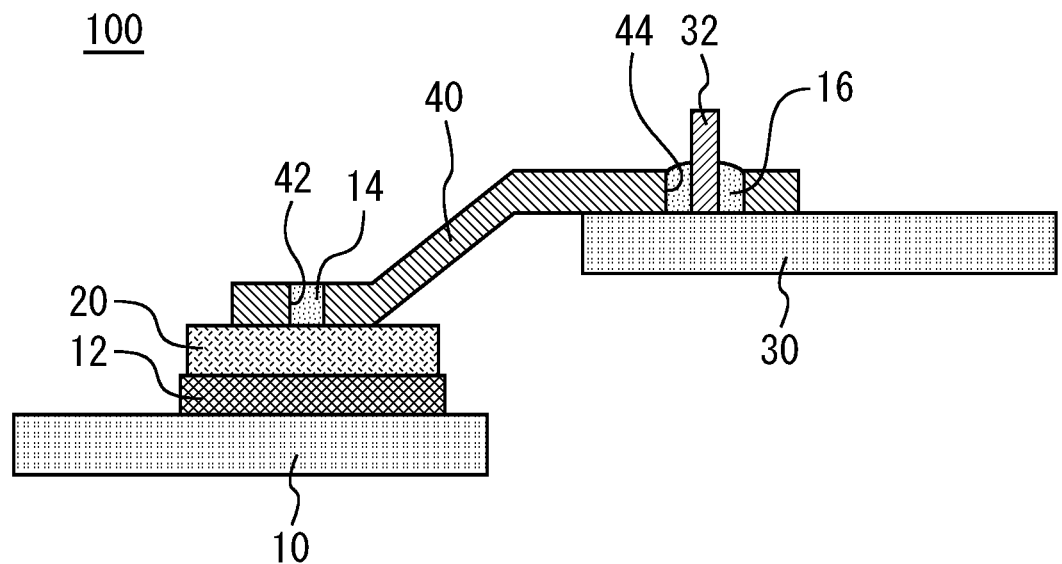
FIG. 2 is a cross-sectional view obtained by cutting along line A-A in FIG. 1.

FIG. 1 is a perspective view of a semiconductor device 100 according to a first embodiment. FIG. 2 is a cross-sectional view obtained by cutting along line A-A in FIG. 1.

In the semiconductor device 100, a semiconductor chip 20 is bonded on a top surface of a circuit pattern 10 through a bonding material 12. A lead 40 is bonded to a top surface of the semiconductor chip 20 through a bonding material 14.

The lead 40 electrically connects the semiconductor chip 20 to a frame 30. A projection 32 projects from an obverse surface of the frame 30. A projection insertion portion 44 into which the projection 32 is to be inserted is formed in the lead 40. The projection insertion portion 44 of the present embodiment is a through hole extending from a top surface to a back surface of the lead 40. The lead 40 contacts directly the frame 30. Specifically, the obverse surface of the frame 30 and the back surface of the lead 40 are in surface contact with each other. A bonding material 16 is used to bond the projection 32 to the lead 40. The bonding material 16 is provided between a side surface the lead 40 forming the projection insertion portion 44 and the projection 32.

The semiconductor chip 20 is, for example, a power semiconductor chip. It is preferable that the circuit pattern 10, the frame 30, and the lead 40 are formed of metal such as Al, Cu, or Au, for example. An opening 42 through which the bonding material 14 is to be exposed may be formed in the lead 40. The opening 42 is provided to inject the bonding material 14. The diameter of the projection insertion portion 44 of the lead 40 is larger than the diameter of the projection 32. The projection 32 is fixed to the frame 30. The projection 32 may be a part of the frame 30.

Each of the bonding materials 12 and 14 is a conductive bonding material such as solder. The bonding material 16 may be solder or a non-conductive bonding material such as silicone rubber. The bonding material 16 may contact the frame 30.

A method of manufacturing the semiconductor device 100 according to the present embodiment will be described. The method of manufacturing the semiconductor device 100 includes the following first to third steps. The first step is performed before the second and third steps. The second and third steps may be simultaneously performed.

The first step is a step of preparing the semiconductor chip 20, the frame 30, and the lead 40. The frame 30 is provided spaced from the semiconductor chip 20, and the projection 32 projects from the obverse surface of the frame 30 in the thickness direction. The lead 40 has a plate shape, and an opening is formed in one or each end of the lead 40.

In the second step, the semiconductor chip 20 and the lead 40 are electrically connected to each other. Specifically, the lead 40 is bonded to the semiconductor chip 20 through the bonding material 14. The bonding material 14 is melted by heating the entire semiconductor device 100, by heating the lead 40 and the semiconductor chip 20, or by applying laser light to the bonding material 14 to heat the bonding material 14. This enables the lead 40 to be bonded to the semiconductor chip 20.

In the third step, the projection 32 is inserted into the projection insertion portion 44 formed in the lead 40, and the projection 32 and the lead 40 are bonded to each other through the bonding material 16 in a state in which the frame 30 and the lead 40 directly contact each other to be electrically connected to each other. The bonding material 16 is melted by heating the entire semiconductor device 100, by heating the lead 40 and the frame 30, or by applying laser light to the bonding material 16. This enables the lead 40 to be bonded to the projection 32. In the case where the bonding material 16 is non-conductive, the bonding material 16 is cured by being heated, so that the lead 40 and the projection 32 are bonded to each other.

Next, the effect of the present embodiment will be described. In the present embodiment, the projection 32 is inserted into the projection insertion portion 44 of the lead 40, whereby the position of the lead 40 can be prevented from being shifted.

As a comparative example relative to the present embodiment, a configuration will be described in which the obverse surface of the frame 30 and the back surface of the lead 40 are bonded to each other through a bonding material, for example. This configuration may make it impossible to sufficiently fill a space between the lead 40 and the frame 30 with the bonding material in the case where the lead 40 is inclined or an amount of the bonding material is small. This may cause a risk that the sufficient bonding strength cannot be obtained. In this way, it is assumed that member variation or assembly variation results in large changes in product life and temperature cycle resistance. This may make it difficult to manage the components and production.

In contrast, in the present embodiment, the projection 32 and the lead 40 can be bonded to each other in the state in which the frame 30 and the lead 40 directly contact each other. Accordingly, the lead 40 and the projection 32 can be stably bonded to each other. This enables stable bonding even when there is the member variation or the assembly variation, whereby the product life and the temperature cycle resistance can be stabilized. Accordingly, the reliability in bonding can be improved. Additionally, the component management and the production management can be easily performed. In this way, the present embodiment makes it possible to stably produce a product capable of maintaining a sufficient bonding strength between the lead 40 and the projection 32 while preventing the position of the lead 40 from being shifted.

In particular, when the bonding material 16 is melted with the laser light, a light amount of the laser light is large, and the resulting thermal energy of the laser light may cause expansion of the frame 30 or the bonding material 16. Furthermore, when the bonding material 16 is melted to be used for bonding, there may be a possibility that the frame 30 is not horizontal. Even in such a case, in the present embodiment, the frame 30 and the lead 40 contact each other, whereby the projection 32 and the lead 40 can be stably bonded to each other. Accordingly, the wide control range of the laser light can be ensured. Additionally, the wide control ranges of the shape of the frame and temperature can be ensured. Accordingly, the production can be easily achieved. In the present embodiment, the lead 40 and the projection 32 are bonded to each other, whereby the bonding area can be limited. Accordingly, the mounting density can be increased.

In the present embodiment, the obverse surface of the frame 30 and the back surface of the lead 40 are in surface contact with each other. This can ensure a large contact area, reducing the contact resistance. Accordingly, the bonding material 16 can be non-conductive. For example, when solder is used as the bonding material 16, the solder cracks easily occur due to stress due to repetitive temperature change. In contrast, when silicone rubber is used as the bonding material 16, the silicone rubber is soft and absorbs the stress due to temperature change, whereby a long life of the bonding portion can be expected. The silicone rubber is generally cheaper than the solder. Therefore, a cost reducing effect can be expected.

The structure of the semiconductor device 100 and the method of manufacturing the semiconductor device 100 are not limited to those mentioned above. For example, the shape of the projection 32 is not limited to a cylindrical shape, and may be formed into a cone shape, a prism shape, or a pyramid shape. In the present embodiment, since electrical connection can be ensured by direct contact between the frame 30 and the lead 40, the projection 32 may be non-conductive.

The semiconductor chip 20 may be made with a wide bandgap semiconductor. The wide bandgap semiconductor is, for example, silicon carbide, a gallium nitride-based material or diamond. According to the present embodiment, even in the case where the semiconductor chip 20 made with the wide bandgap semiconductor operates at a high temperature, the temperature cycle resistance can be stabilized, so that the semiconductor chip 20 can be stably operated.

These modifications can be appropriately applied to semiconductor devices and methods of manufacturing the semiconductor devices according to embodiments below. Meanwhile, for the semiconductor devices and the methods of manufacturing the semiconductor devices according to the embodiments below, dissimilarities with the first embodiment will mainly be explained as they have many similarities with the first embodiment.

Second Embodiment

Figure 3:
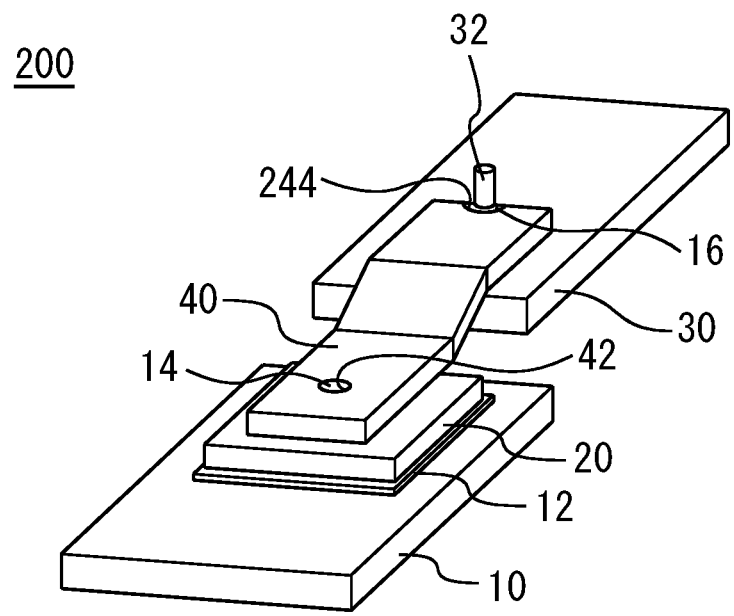
FIG. 3 is a perspective view of a semiconductor device according to a second embodiment.

FIG. 3 is a perspective view of a semiconductor device 200 according to a second embodiment. A lead 40 need not cover the entire periphery of a projection 32. A projection insertion portion 244 may be a cutout formed in an end of the lead 40. Also in this case, the lead 40 and the projection 32 can be stably bonded to each other while preventing the position of the lead 40 from being shifted.

Third Embodiment

Figure 4:
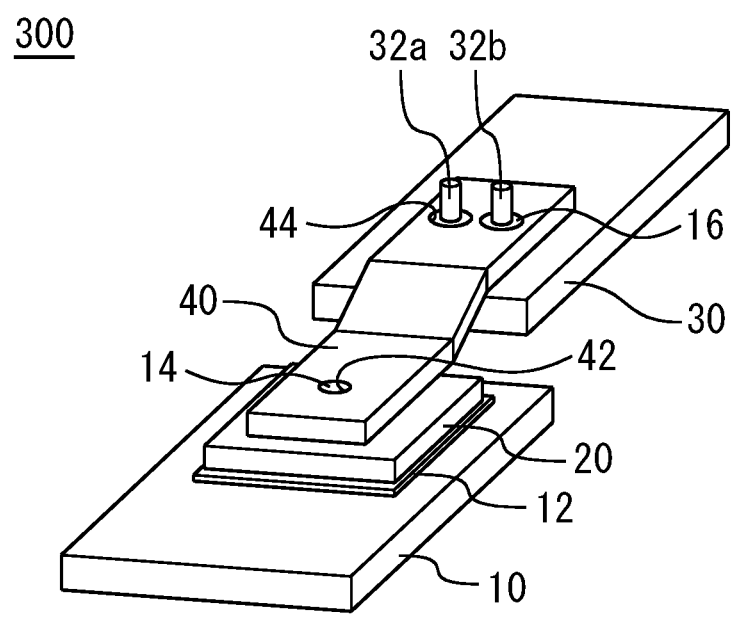
FIG. 4 is a perspective view of a semiconductor device according to a third embodiment.

FIG. 4 is a perspective view of a semiconductor device 300 according to a third embodiment. A plurality of projection insertion portions 44 may be formed in a lead 40. At this time, a plurality of projections 32a and 32b project from a frame 30, and are inserted into the plurality of projection insertion portions 44 in one-to-one correspondence. The number of projections 32 to be provided may be three or more.

Such a configuration can prevent the lead 40 from rotating around the projections 32 when the bonding material 16 is melted. Thus, a portion to which the bonding material 16 is provided can be limited, whereby the mounting density can be increased. The configuration in which such a rotation is prevented is effective especially in the case where the bonding material 14 and the bonding material 16 are simultaneously melted or in the case where the frame 30 and the lead 40 are bonded to each other before the semiconductor chip 20 and the lead 40 are bonded to each other. The case where the bonding material 14 and the bonding material 16 are simultaneously melted refers to, for example, the case where the bonding materials 14 and 16 are made of the same material and the entire semiconductor device 300 is heated to melt the bonding material 16.

Fourth Embodiment

In the present embodiment, a frame 30 and a projection 32 are integrally formed with each other. That is, the frame 30 and the projection 32 are formed of the same material as the same component. Here, a component including the frame 30 and the projection 32 is referred to as a frame portion.

The rigidity of the frame portion can be increased by integrally forming the frame 30 and the projection 32. Additionally, a fixing position of the projection 32 can be prevented from being shifted with respect to the frame 30 in the high temperature state in which the bonding material 16 is melted. Accordingly, the mounting density can be increased. The frame portion is an integrated component, which can make it difficult to separate the frame 30 from the projection 32 in the temperature cycle during use, whereby a long life can be expected. Furthermore, the number of components can be reduced, which makes it possible to easily manage the components.

Fifth Embodiment

Figure 5:
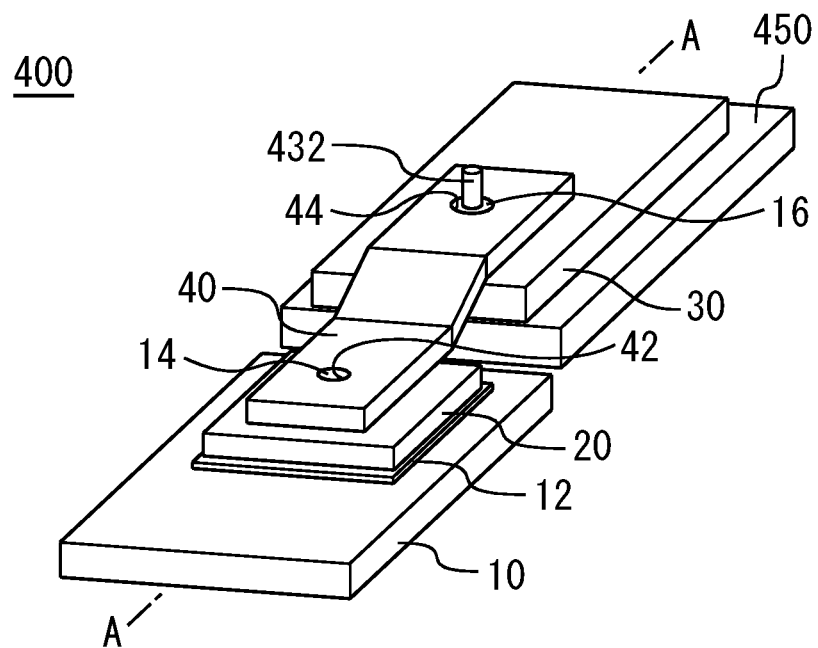
FIG. 5 is a perspective view of a semiconductor device according to a fifth embodiment.
Figure 6:
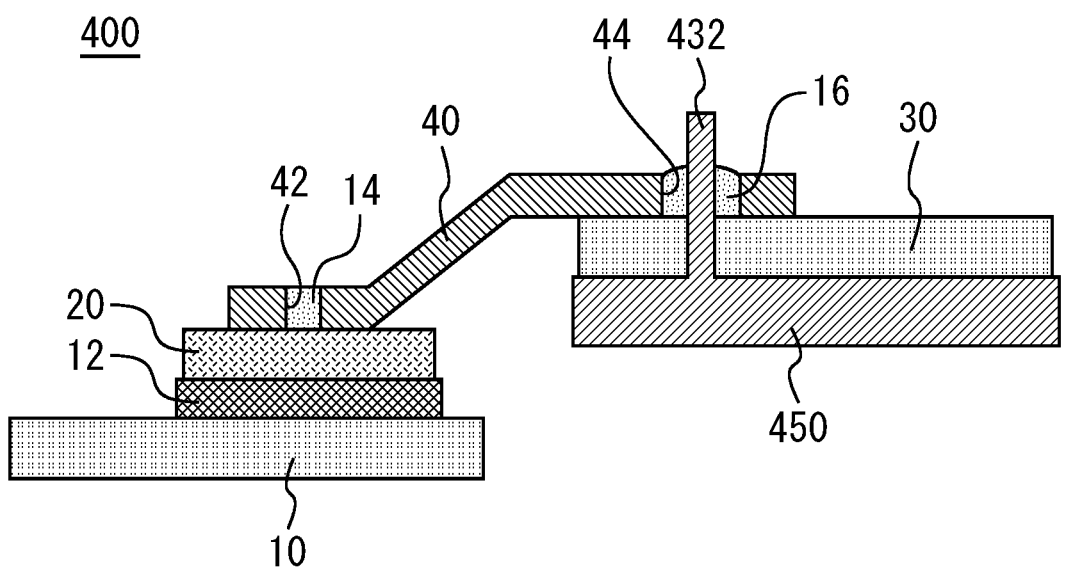
FIG. 6 is a cross-sectional view obtained by cutting along line A-A in FIG. 5.

FIG. 5 is a perspective view of a semiconductor device 400 according to a fifth embodiment. FIG. 6 is a cross-sectional view obtained by cutting along line A-A in FIG. 5. The semiconductor device 400 includes a case 450 configured to store a semiconductor chip 20. A projection 432 of the present embodiment is a part of the case 450. A through hole is formed in a frame 30. The projection 432 projects from the frame 30 through the frame 30. In the present embodiment, the frame 30 is insert molded with the case 450.

Figure 7:
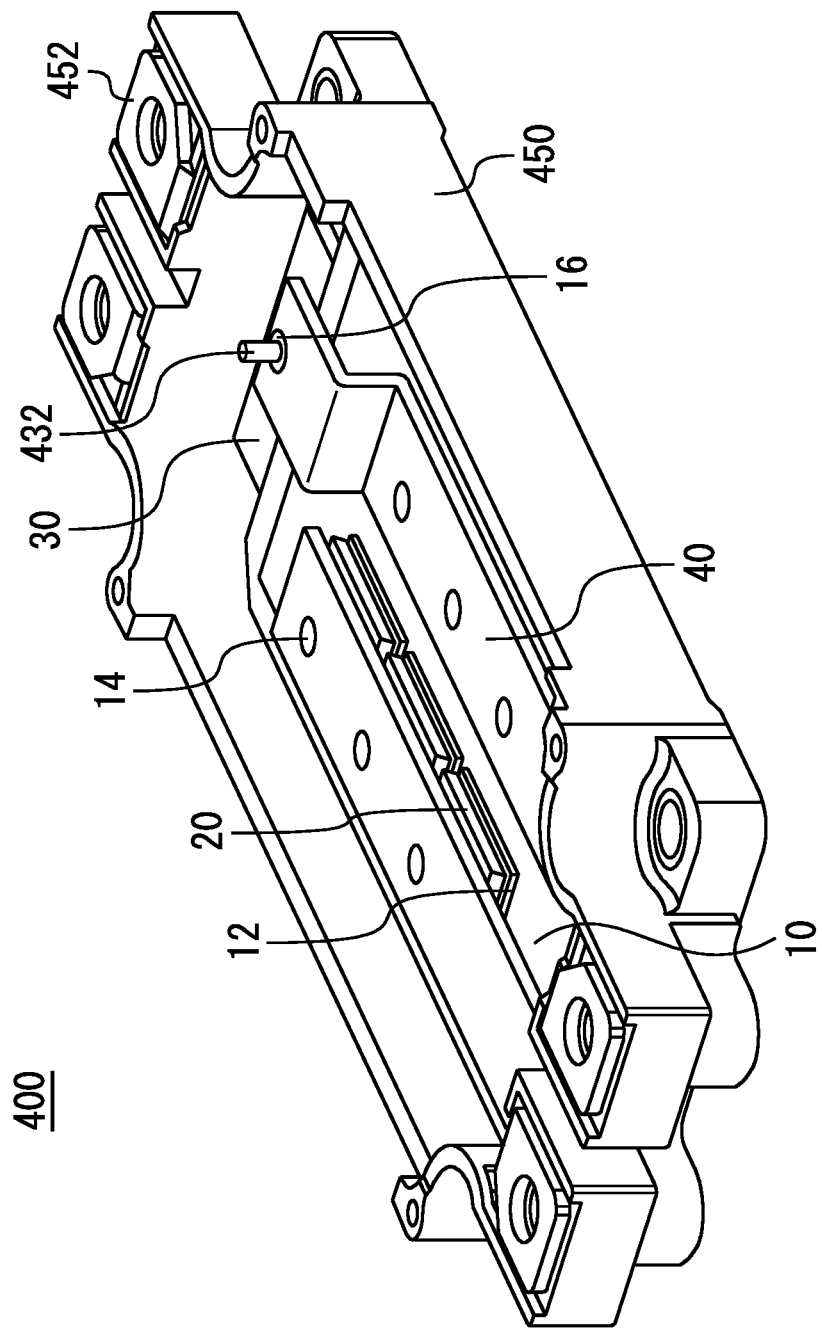
FIG. 7 is a perspective view illustrating an overall configuration of the semiconductor device according to the fifth embodiment.

FIG. 7 is a perspective view illustrating an overall configuration of the semiconductor device 400 according to the fifth embodiment. The case 450 is formed of a synthetic resin such as polyphenylenesulfide (PPS), for example. The case 450 may store a plurality of semiconductor chips 20 and a plurality of leads 40. The frame 30 is placed on a seat portion in a peripheral portion of the case 450, for example. The semiconductor chip 20 is electrically connected to an external connection terminal 452 through the frame 30 to electrically connect the semiconductor device 400 to the outside.

In the present embodiment, the projection 432 is produced when the case 450 is formed, which makes it possible to easily form the projection 432. The frame 30 and the case 450 are formed of different materials. Therefore, the projection 432 can be identified using image recognition or the like when the lead 40 is mounted. Accordingly, the assembly can be easily achieved.

Note that the structure of the case 450 of the present embodiment can be applied to the other embodiments.

Sixth Embodiment

Figure 8:
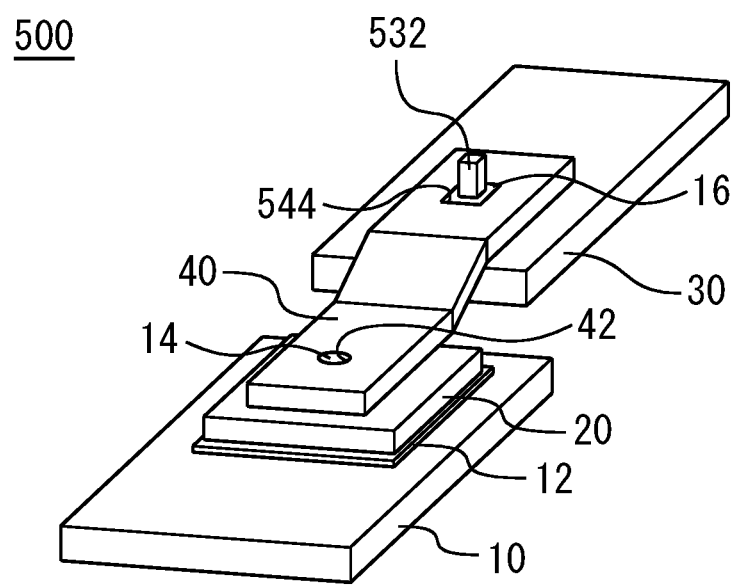
FIG. 8 is a perspective view of a semiconductor device according to a sixth embodiment.

FIG. 8 is a perspective view of a semiconductor device 500 according to a sixth embodiment. A projection insertion portion 544 is formed into a polygonal shape as viewed in a direction in which the projection 532 extends from the frame 30. The projection 532 is formed into a polygonal shape as viewed in the direction in which the projection 532 extends from the frame 30. The projection 532 is provided to prevent the lead 40 from rotating around the projection 532. That is, corners of the projection 532 contacts side surfaces of the lead 40 forming the projection insertion portion 544, which makes it possible to prevent the rotation of the lead 40.

Such a configuration can prevent the lead 40 from rotating around the projection 532 when the bonding material 16 is melted. Accordingly, the mounting density can be increased. The configuration in which such a rotation is prevented is effective especially in the case where the bonding material 14 and the bonding material 16 are simultaneously melted or in the case where the frame 30 and the lead 40 are bonded to each other before the semiconductor chip 20 and the lead 40 are bonded to each other.

In an example of FIG. 8, the projection 532 is formed into a prism shape that has a square shape on the plan view. The shape of the projection 532 is not limited thereto, and may be a rectangular, quadrangular shape, or polygonal shape other than quadrangular shape on the plan view. Alternatively, the projection 532 may be formed into a pyramid shape. Additionally, the projection insertion portion 544 may have any shape that can prevent rotation of the lead 40 according to the shape of the projection 532.

Seventh Embodiment

Figure 9:
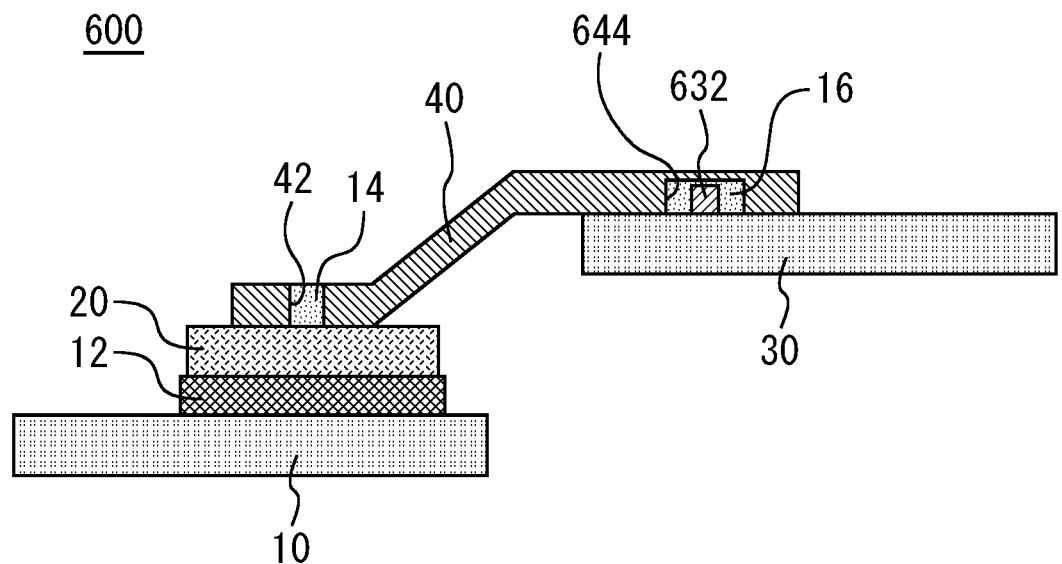
FIG. 9 is a perspective view of a semiconductor device according to a seventh embodiment.

FIG. 9 is a perspective view of a semiconductor device 600 according to a seventh embodiment. In the present embodiment, a height of a projection 632 from a frame 30 is 2 mm or less. A projection insertion portion 644 is a non-through hole. A lead 40 covers the projection 632.

Figure 10:
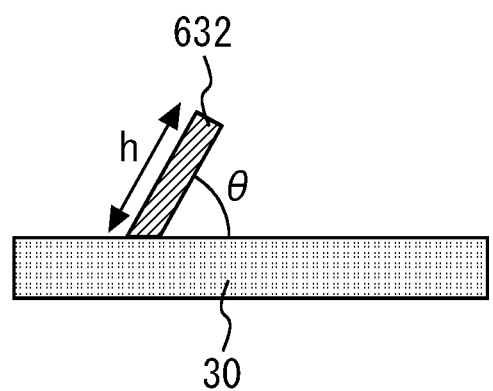
FIG. 10 is a diagram illustrating a state in which the projection is inclined.

FIG. 10 is a diagram illustrating a state in which the projection 632 is inclined. The height of the projection 632 is referred to as h, and the inclination of the projection 632 with respect to the obverse surface of the frame 30 is referred to as θ. At this time, a shift amount of bonding position of the lead 40 shifted from the target position due to the inclination of the projection 632 becomes h×cos θ at the maximum. When the height h of the projection 632 is 2 mm or less, the shift of the bonding position is limited, whereby the production can be easily achieved.

Eighth Embodiment

Figure 11:
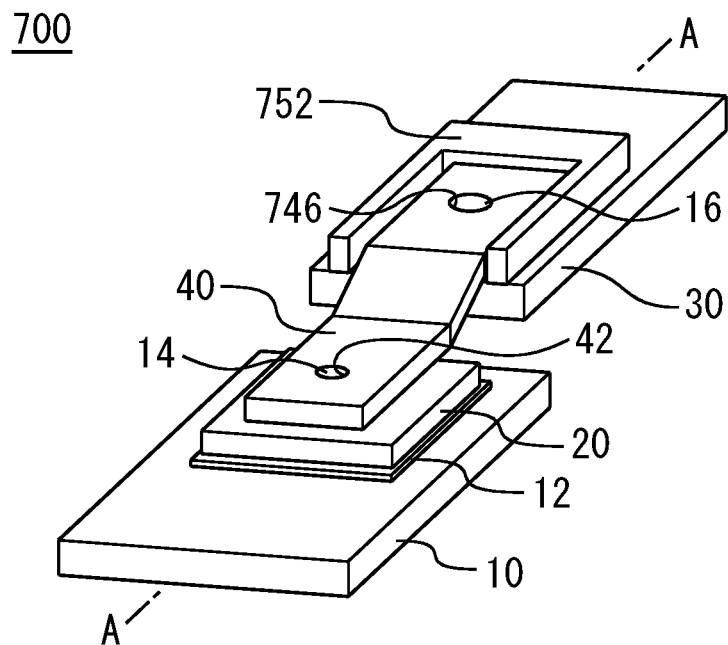
FIG. 11 is a perspective view of a semiconductor device according to an eighth embodiment.
Figure 12:
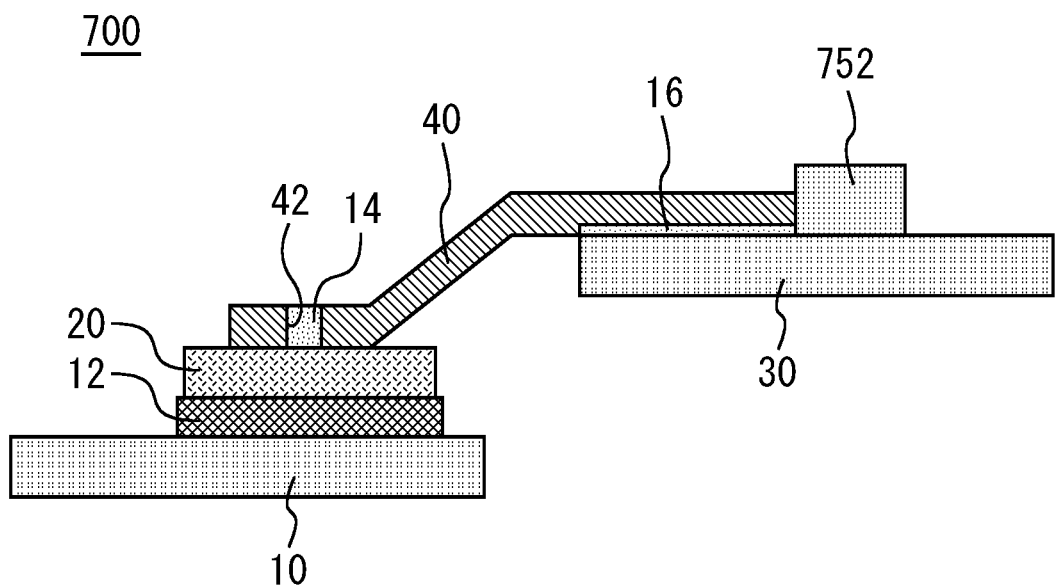
FIG. 12 is a cross-sectional view obtained by cutting along line A-A in FIG. 11.

FIG. 11 is a perspective view of a semiconductor device 700 according to an eighth embodiment. FIG. 12 is a cross-sectional view obtained by cutting along line A-A in FIG. 11. A lead 40 has one end bonded to a semiconductor chip 20, and has the other end bonded to an obverse surface of a frame 30 through a bonding material 16. The lead 40 electrically connects the semiconductor chip 20 to the frame 30. In the present embodiment, the bonding material 16 is provided between a back surface of the lead 40 and the obverse surface of the frame 30. As illustrated in FIG. 11, the bonding material 16 may be provided in a through hole 746 formed in the lead 40. However, the through hole 746 is not illustrated in FIG. 12.

The semiconductor device 700 includes a case 450 (not illustrated). The case 450 of the present embodiment has a similar structure to that of the case 450 illustrated in FIG. 7, for example. The frame 30 is integrated with the case 450. The frame 30 is insert molded with the case 450. The case 450 has a protrusion 752 projecting from the obverse surface of the frame 30. The protrusion 752 is a part of the case 450. The protrusion 752 is provided on the periphery of the bonding portion between the obverse surface of the frame 30 and the lead 40. An end of the lead 40 is surrounded by the protrusion 752 as viewed in a direction perpendicular to the obverse surface of the frame 30.

A method of manufacturing the semiconductor device 700 according to the present embodiment will be described. The method of manufacturing the semiconductor device 700 according to the present embodiment includes first to third steps. The first step is performed before the second and third steps. The second and third steps may be simultaneously performed.

The first step is a step of preparing the semiconductor chip 20 to be mounted on a circuit pattern 10, the frame 30 to be provided spaced from the semiconductor chip 20, and the plate-shaped lead 40. In the first step, the frame 30 is insert molded with the case 450, and the protrusion 752 projecting from the obverse surface of the frame 30 is formed in the case 450.

The second step is a step of bonding the lead 40 to the semiconductor chip 20 through the bonding material 14. The bonding material 14 is melted by heating the entire semiconductor device 700, by heating the lead 40 and the semiconductor chip 20, or by applying laser light to the bonding material 14 to heat the bonding material 14. This enables the lead 40 to be bonded to the semiconductor chip 20.

The third step is a step of bonding the end of the lead 40 to a portion surrounded by the protrusion 752 in the obverse surface of the frame 30 through the bonding material 16. The bonding material 16 is melted by heating the entire semiconductor device 700, by heating the lead 40 and the frame 30, or by applying laser light to the bonding material 16 to heat the bonding material 16. This enables the lead 40 to be bonded to the frame 30. Through the second and third steps, the lead 40 electrically connects the semiconductor chip 20 to the frame 30.

The protrusion 752 is provided on the periphery of the bonding portion between the obverse surface of the frame 30 and the lead 40. Therefore, the bonding surface of the lead 40 is located lower than the surrounding area, whereby the bonding area between the frame 30 and the lead 40 is limited by the protrusion 752. That is, the bonding area can be limited by the protrusion 752 when the bonding material 16 is melted. Accordingly, the lead 40 and the frame 30 can be stably bonded to each other. Additionally, the mounting density can be increased.

The frame 30 and the case 450 of the present embodiment are formed as an integrated component. Therefore, the number of components to be managed at the time of assembly can be reduced, which makes it possible to easily manage the components. The frame 30 and the protrusion 752 are formed of different materials. Therefore, the bonding surface can be identified using image recognition or the like when the lead 40 is mounted, whereby the assembly can be easily achieved.

In the present embodiment, the three sides of the lead 40 are covered by the protrusion 752. The configuration is not limited thereto, and it is only required that the protrusion 752 is provided on the periphery of the bonding portion between the obverse surface of the frame 30 and the lead 40. For example, it is only required that the protrusion 752 covers one or more sides of the lead 40. The bonding portion between the obverse surface of the frame 30 and the lead 40 may be sandwiched in the protrusion 752 as viewed in a direction perpendicular to the obverse surface of the frame 30. The lead 40 may contact or be separated from the protrusion 752. The through hole 746 need not be provided in the lead 40.

Ninth Embodiment

A linear expansion coefficient of the protrusion 752 may be smaller than that of the frame 30. This makes it possible to ensure a desired bonding area even in the case where the frame 30 becomes high temperature when the bonding material 16 is melted.

Meanwhile, technical features explained in each embodiment may be appropriately combined to use.

In the semiconductor device according to the first disclosure and the method of manufacturing a semiconductor device according to the third disclosure, the projection and the lead can be bonded to each other while the frame and the lead directly contact each other. Accordingly, the lead and the projection can be stably bonded to each other.

In the semiconductor device according to the second disclosure and the method of manufacturing a semiconductor device according to the fourth disclosure, the protrusion is provided on the periphery of the bonding portion between the obverse surface of the frame and the lead. This enables the bonding area to be limited when the bonding material is melted. Accordingly, the lead and the frame can be stably bonded to each other.

Obviously many modifications and variations of the present disclosure are possible in the light of the above teachings. It is therefore to be understood that within the scope of the appended claims the disclosure may be practiced otherwise than as specifically described.

The entire disclosure of a Japanese Patent Application No. 2021-111610, filed on Jul. 5, 2021 including specification, claims, drawings and summary, on which the Convention priority of the present application is based, are incorporated herein by reference in its entirety.

The invention claimed is:

1. A semiconductor device, comprising:
   a semiconductor chip;
   a frame including an obverse surface;
   a projection projecting from the obverse surface of the frame;
   a lead including a back surface and a projection insertion portion into which the projection is to be inserted a portion of the back surface of the lead making direct surface contact with a portion of the obverse surface of the frame to electrically connect the semiconductor chip to the frame; and
   a first bonding material configured to bond the projection to the lead.

2. The semiconductor device according to claim 1, wherein the first bonding material is provided between a side surface of the lead forming the projection insertion portion and the projection.

3. The semiconductor device according to claim 1, wherein the first bonding material is non-conductive.

4. The semiconductor device according to claim 1, wherein the frame and the lead are in surface contact with each other.

5. The semiconductor device according to claim 1, wherein
   the lead and the semiconductor chip are bonded to each other through a second bonding material, and
   an opening through which the second bonding material is to be exposed is formed in the lead.

6. The semiconductor device according to claim 1, wherein the projection insertion portion is a through hole.

7. The semiconductor device according to claim 1, wherein the projection insertion portion is a non-through hole.

8. The semiconductor device according to claim 1, wherein the projection insertion portion is a cutout formed in an end of the lead.

9. The semiconductor device according to claim 1, wherein a plurality of the projection insertion portions are formed in the lead.

10. The semiconductor device according to claim 1, wherein the frame and the projection are formed of a same material as a same component.

11. The semiconductor device according to claim 1, further comprising a case configured to store the semiconductor chip, wherein
    the projection is a part of the case.

12. The semiconductor device according to claim 11, wherein the projection projects from the frame through the frame.

13. The semiconductor device according to claim 1, wherein the projection is non-conductive.

14. The semiconductor device according to claim 1, wherein
    the projection insertion portion is formed into a polygonal shape as viewed in a direction in which the projection extends from the frame, and
    the projection is formed into a polygonal shape as viewed in the direction in which the projection extends from the frame so that the lead is prevented from rotating around the projection.

15. The semiconductor device according to claim 1, wherein a height of the projection from the frame is 2 mm or less.

16. The semiconductor device according to claim 1, wherein the semiconductor chip is made with a wide band gap semiconductor.

17. The semiconductor device according to claim 16, wherein the wide band gap semiconductor is silicon carbide, gallium-nitride-based material or diamond.

* * * * *